United States Patent

Stengl et al.

[11] Patent Number: 5,817,553
[45] Date of Patent: Oct. 6, 1998

[54] PROCESS FOR MANUFACTURING CAPACITORS IN A SOLID STATE CONFIGURATION

[75] Inventors: Reinhard Stengl, Standtbergen; Martin Franosch, München; Hermann Wendt, Grasbrunn, all of Germany

[73] Assignee: Siemens Aktiengesellschaft, Munich, Germany

[21] Appl. No.: 766,977

[22] Filed: Dec. 16, 1996

[30] Foreign Application Priority Data

Dec. 15, 1995 [DE] Germany .................. 195 46 999.2

[51] Int. Cl.$^6$ ................................ H01L 21/8242
[52] U.S. Cl. ............................. 438/253; 438/254
[58] Field of Search .................... 438/238–241, 438/253–256, 396–397

[56] References Cited

U.S. PATENT DOCUMENTS

| 5,053,351 | 10/1991 | Fazan et al. | 438/397 |
| 5,196,365 | 3/1993 | Gotou | 438/254 |
| 5,384,276 | 1/1995 | Ogawa et al. | 438/397 |
| 5,637,523 | 6/1997 | Fazan et al. | 438/397 |

FOREIGN PATENT DOCUMENTS

0415530B1  3/1991  European Pat. Off. .

OTHER PUBLICATIONS

"Anisotropic Etching of Crystalline Silicon in Alkaline Solutions", J. Electrochem. Soc., vol. 137, No. 11, Nov. 1990.

"Multi–Shell Trench Capacitor Cell for Quarter Giga Bit Dram and Beyond", IBM Corp. 1990, pp. 473–474.

"A Deep–Trenched Capacitor Technology For 4 Mega Bit Dynamic Ram", Yamada et al., IDEM 1985, pp. 702–705.

*Primary Examiner*—Jey Tsai
*Attorney, Agent, or Firm*—Herbert L. Lerner; Laurence A. Greenberg

[57] ABSTRACT

Capacitors, in particular stacked capacitors for a dynamic memory cell configuration are manufactured by first forming a sequence of layers, which include layers made of a first conductive material alternating with layers made of a second material. The second material can be selectively etched with respect to the first material. Layered structures are formed from the sequence of layers, with the flanks of the layered structures each having a conductive support structure. The layered structures are formed with openings, such as gaps, in which the surface of the layers is exposed. The layers made of the second material are selectively removed with respect to the layers made of the first material. The exposed surface of the layers made of the first material and of the support structure are provided with a capacitor dielectric, onto which a counter-electrode is placed. The capacitor is made by etching $p^-$-doped polysilicon that is selective to $p^+$-doped polysilicon.

6 Claims, 5 Drawing Sheets

PROCESS FOR MANUFACTURING CAPACITORS IN A SOLID STATE CONFIGURATION

BACKGROUND OF THE INVENTION

FIELD OF THE INVENTION

Capacitors on a solid state basis are required for various integrated circuit types, for example, dynamic memory cell configurations, analog to digital and digital to analog converters as well as filter circuits. In the manufacture of capacitors on a solid state basis, the problem to be overcome with respect to an increased integration density or reduced chip surface is how to reduce the space requirements of the capacitor while maintaining the same capacity.

This problem is particularly serious in the case of dynamic solid state memories for which the required surface area of the generally used single-transistor memory cell is reduced from one memory generation to the next with increasing memory density. At the same time, a certain minimum capacity of the memory capacitor must be retained.

A single-transistor memory cell of a dynamic solid state configuration (DRAM memory configuration) comprises a read-out transistor and a capacitor. In the capacitor, the information is stored in the form of an electric charge, which represents a logical variable, zero or one. This information can be read out via a bit line by driving the read-out transistor via a word line. The capacitor must have a minimum capacity so that the charge can be safely stored and at the same time the information read out can be differentiated. At present, the lower limit for the capacity of the memory capacitor is viewed as 25 fF.

Up to the 1 Mbit generation, the read-out transistor as well as the capacitor were implemented as planar components. After the 4 Mbit memory generation, the memory cell was further reduced in surface area through a three-dimensional arrangement of the read-out transistor and the memory capacitor. One way of achieving this is to implement the memory capacitor in a trench (see, for example, K. Yamada et al, Proc. Intern. Electronics Devices and Materials IEDM 85, page 702 ff.). In this case, the electrodes of the memory capacitor are arranged along the surface of the trench. This enlarges the effective surface area of the memory capacitor, on which the capacity depends, with respect to the space requirements on the surface of the substrate for the memory capacitor corresponding to the cross-section of the trench.

Another way of increasing the memory capacity while maintaining or reducing the space requirement of the memory capacitor is to embody the memory capacitor as a multilayer capacitor, known as a "stacked capacitor". A structure made of polysilicon, for example a multi-circuit structure or a cylinder, is formed over the word lines, said structure being bonded with the substrate. This polysilicon structure forms the memory node, which is provided with a capacitor dielectric and a capacitor plate. The advantage of this design is that it is highly compatible with a logic process. The free space above the substrate surface is used for the memory capacitor. The entire cell surface area can be covered by the polysilicon structure as long as the polysilicon structures are isolated from the adjacent memory cells.

A memory cell configuration having a stacked capacitor as the memory capacitor is disclosed in European patent publication EP 0 415 530 B1. The stacked capacitor comprises a polysilicon structure having a plurality of polysilicon layers, which are basically disposed parallel to and on top of each other and which are connected to each other by at least one lateral support. These layers, being arranged in the manner of a cooling rib, bring about a distinct enlargement in the surface of the polysilicon structure in relation to the projection of the polysilicon structure on the substrate surface.

The polysilicon structure is formed through alternating deposition of polysilicon layers and of $SiO_2$ layers that can be etched selectively on the surface of the substrate, structuring of these layers, creation of flank covers (spacers of polysilicon) on at least one flank of the layered structure and selective etching-out of the $SiO_2$ layers. The polysilicon structures are thereby doped with arsenic. Then, silicon oxide is formed through thermal oxidation as a capacitor dielectric on which a cell plate of doped polysilicon is deposited.

SUMMARY OF THE INVENTION

It is accordingly an object of the invention to provide a process for manufacturing capacitors in a solid state configuration (specifically a DRAM configuration), which overcomes the above-mentioned disadvantages of the heretofore-known devices and methods of this general type and which attains increased packing density with a reduced process expenditure as compared to the known prior art processes.

With the foregoing and other objects in view there is provided, in accordance with the invention, a process of manufacturing capacitors in a solid state configuration, which comprises:

forming a sequence of layers of a plurality of layers made of a first material alternating with layers made of a second material, the first material being electrically conductive and the second material being selectively etchable relative to the first material;

structuring the sequence of layers and forming at least one layered structure with flanks;

building a support structure of conductive material, the support structure covering at least the flanks of the layered structure;

forming at least one opening in the layered structure and exposing the surface of the layers made of the first and the second material in the at least one opening;

selectively removing the layers made of the second material relative to the layers made of the first material and to the support structure;

providing a capacitor dielectric on the exposed surface of the layers made of the first material and of the support structure; and forming a gate electrode on a surface of the capacitor dielectric.

In other words, a sequence of layers is first created on a substrate, which sequence of layers comprises layers made of a first material alternating with layers made of a second material. The first material is electrically conductive. The second material can be etched selectively in relation to the first material. The sequence of layers is structured such that at least one layer structure having flanks reaching as far as the substrate is formed. A support structure of conductive material is formed, which covers at least the flanks of the layered structure. Then, in the layered structure, at least one opening is formed, in which the surface of the layers made of the first and the second material is exposed. Then the layers made of the second material are removed selectively in relation to the layers made of the first material and the support structure. The uncovered surface of the layers made of the first material and of the support structure is provided with a capacitor dielectric. A counter-electrode is formed on the surface of the capacitor dielectric.

When the layers made of the second material are etched out, the support structure is arranged on at least three flanks of the layered structure. This ensures a high level of mechanical stability, which prevents the layers made of the first material from sticking together as the layers made of the second material are being etched out. Since this mechanical stability is ensured through the support structure, the thickness of the layers made of the first material can be selected independently of the mechanical stability requirements of the layers made of the first material. The layers made of the first material can be implemented in particular in a thickness range between 20 to 50 nm and 20 to 50 nm. This also reduces the overall height of the capacitor while maintaining the same capacity.

Preferably, the layers made of the first material and the support structure are formed of $p^+$-doped silicon with a dopant concentration $>10^{20}$ cm$^{-3}$, and the layers made of the second material are formed of a $p^-$-doped silicon with a dopant concentration $<10^{19}$ cm$^{-3}$. The fact that $p^-$-doped silicon can be etched selectively in relation to $p^+$-doped silicon is disclosed in H. Seidel et al., J. Electrochem. Soc. Vol. 137 (1990), pages 3626 and following. Etch rate differences up to a factor of 1000 are attained between silicon having a boron doping $>10^{20}$ cm$^{-3}$ and silicon having a boron doping $<10^{19}$ cm$^{-3}$.

$P^{30}$-doped silicon and $p^-$-doped silicon can be deposited in the same reactor. In this way, the sequence of layers can be implemented without switching the system by simply switching over the process parameters. The process is thus simplified considerably.

The support structure made of doped silicon can be formed through selective epitaxial growth of doped silicon or through in situ doped deposition and anisotropic back-etching of a doped polysilicon layer. Both alternatives can be carried out in the temperature range below 800° C., which prevents the layers made of $p^+$-doped silicon and $p^-$-doped silicon from diffusing into each other. Accordingly, in a further feature of the invention, the selective epitaxial growth is performed with the use of $SiCl_2H_2$, HCl, $H_2$, $B_2H_6$ in a temperature range between 700° C. and 750° C.

In an alternative embodiment, the step of forming the sequence of layers of the first material alternating with the layers of the second material comprises in situ doped deposition of polysilicon; and the building step comprises in situ doped deposition and anisotropic back etching of a doped polysilicon layer.

In both cases, the support structure is formed with defined surfaces on the flanks of the layered structure. This ensures that the layers made of the second material are etched out evenly between the layers made of the first material. This prevents a situation whereby some layers made of the second material are not yet etched out, while at other places, the support structures are already acted upon to such an extent that some layers made of the first material are falling down.

In accordance with an additional mode of the invention, the step of forming the at least one opening in the layered structure comprises dividing the layered structure with the support structure into two sections separated by a gap.

Accordingly, on formation of the opening in the layered structure, the layered structure and the support structure are divided into two sections, which are separated by a gap reaching down as far as the surface of the substrate. Two capacitors are formed from the two sections. The distance and the structural size of the sections can be formed according to the minimum structural size (F) in the technology in question. This creates a high packing density.

In accordance with a concomitant feature of the invention, the sequence of layers is formed on a substrate. The substrate is thereby a solid state substrate having selection transistors, bit lines, word lines and an insulating layer supporting the sequence of layers.

In other words, in the manufacture of the capacitor as a memory capacitor for a dynamic memory cell configuration, the capacitor is preferably manufactured as a stacked capacitor. In this case, the substrate comprises a solid state substrate having selection transistors, bit lines, word lines and an insulating layer. The sequence of layers is formed on the surface of the insulating layer. Preferably, the insulating layer is planarized, with the result that the sequence of layers is formed on a basically planar surface.

Other features which are considered as characteristic for the invention are set forth in the appended claims.

Although the invention is illustrated and described herein as embodied in a process of manufacturing capacitors in a solid state configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
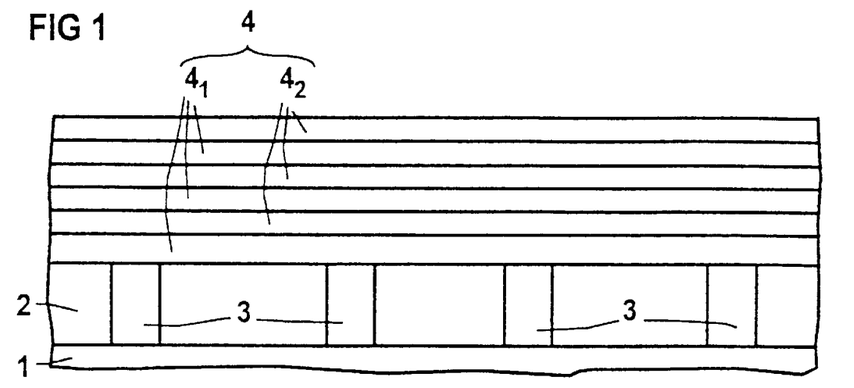
FIG. 1 is a side elevational view of a substrate and a sequence of layers which includes alternating layers made of a first material and layers made of a second material.
Figure 2:
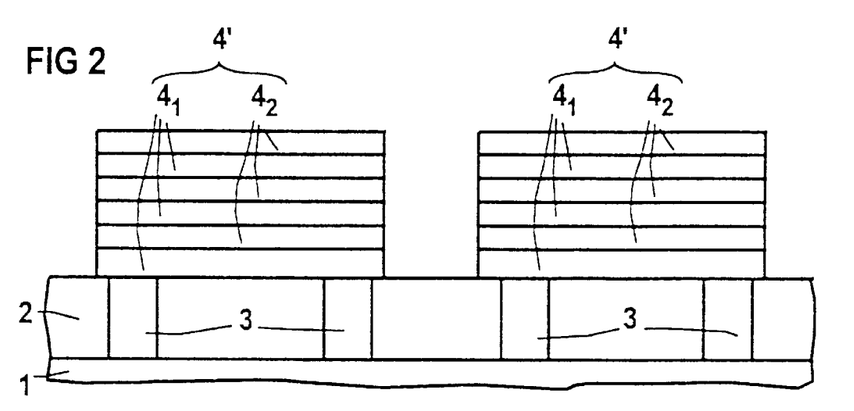
FIG. 2 is a similar view of the substrate with layered structures.

Referring now to the figures of the drawing in detail and first, particularly, to FIG. 1 thereof and then sequentially to FIGS. 2–6, an insulating layer 2 is applied to a substrate 1. The substrate 1 is, for example, a solid state substrate, specifically a monocrystalline silicon wafer comprising selection transistors having word lines and bit lines. The insulating layer is formed of $SiO_2$, for example, and is planarized with the help of planarizing method (see FIG. 1). In the insulating layer 2, contact holes 3 are opened and filled in with an electrically conductive material, for example, doped polysilicon, tungsten, tantalum, titanium, titanium nitride or tungsten silicide. Contact holes 3 are arranged such that they each reach a source/drain area of one of the selection transistors in substrate 1.

A sequence of layers 4 is applied to the surface of insulating layer 2, which sequence of layers comprises alternating $p^+$-doped polysilicon layers $4_1$ and $p^-$-doped polysilicon layers $4_2$. The p+ doped polysilicon layers $4_1$ have a dopant concentration of, for example, $5 \times 10^{20}$ cm$^{-3}$. The $p^-$-doped polysilicon layers $4_2$ have a dopant concentration of, for example, $1 \times 10^{19}$ cm$^{-3}$. The p+-doped polysilicon layers $4_1$ and the $p^{31}$-doped polysilicon layers $4_2$ are deposited in a layer thickness of 20 nm each, for example, through a CVD process.

The uppermost layer of the sequence of layers is a $p^-$-doped polysilicon layer $4_2$.

Then, layered structures 4' are formed from the sequence of layers 4 through anisotropic etching, using a mask. The surface of insulating layer 2 is uncovered between layered structures 4'(see FIG. 2). The anisotropic etching is done, for example, with $CF_4$ and $SF_6$.

Figure 3:
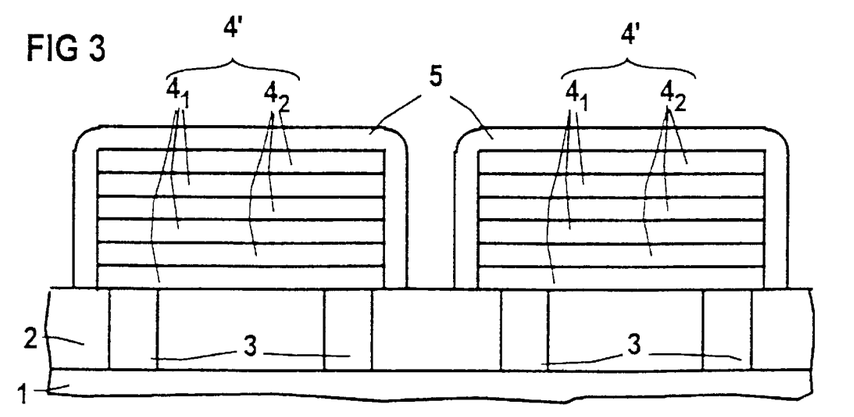
FIG. 3 is a view of the system after the formation of a support structure, which covers the flanks of the layered structures.

Then, a support structure 5 is formed by means of selective epitaxial growth of silicon (see FIG. 3). The selective epitaxial growth is performed in a process using $SiCl_2H_2$, HCl, $H_2$, $B_2H_6$ as a process gas in the temperature range between 700° C. and 750° C. The process temperature is chosen in this low temperature range in order to prevent p+ doped polysilicon layers $4_1$ and $p^-$-doped polysilicon layers $4_2$ from diffusing into each other. In selective epitaxial growth, support structure 5 grows $p^+$-doped in situ on the surface of support structures 4'. However, there is no epitaxial growth of silicon on the surface of insulating layer 2. Support structure 5 completely covers the flanks and the surface of layered structures 4'.

Figure 4:
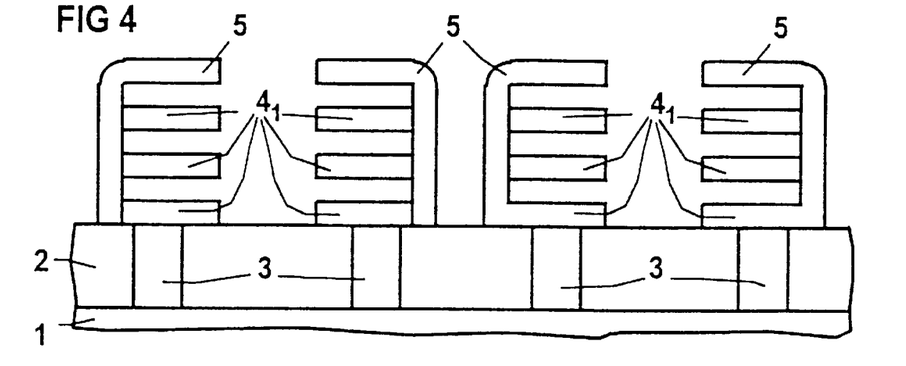
FIG. 4 is a view of the system after the formation of an opening in the layered structures and selective etching out of layers made of the second material.

Then, layered structures 4' are structured with support structure 5 covering them, with the use of a mask created in a photolithographic manner, through anisotropic etching, for example, with $CF_4$ and $SF_6$, such that two sections are formed. The two sections are separated from each other by a gap. In the region of the gap, the sections each have one flank, on which the surface of the $p^-$-doped layers $4_2$ and the $p^+$doped layers $4_1$is uncovered.

The remaining parts of the $p^-$-doped polysilicon layers $4_2$ are then removed through an etching that is selective to $p^+$doped polysilicon and $SiO_2$. The selective etching is done, for example, in an alkaline etchant solution containing ethylenediamine, catechol, pyrazine and water.

Preferably, the concentration of the solution is in the following region: 1 liter ethylenediamine, 160 g catechol, 6 g pyrazine and 133 ml water. KOH can also be used as an etchant solution, with a concentration in the region of 10 to 50 percent in weight. This etching has a selectivity of at least 1:500 with respect to p+ doped polysilicon and $p^-$-doped polysilicon.

The $p^+$-doped layers $4_1$and support structure 5, which are not affected by the selective etching, are connected to each other mechanically and electrically.

Figure 5:
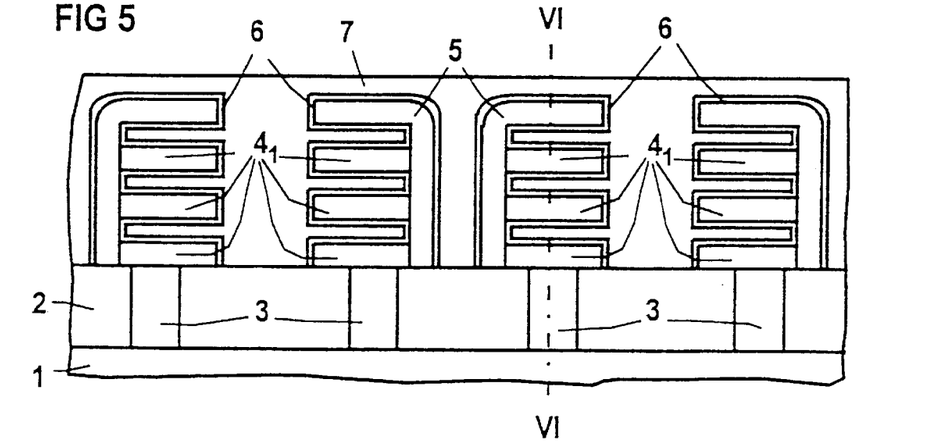
FIG. 5 is a similar view of the system after the formation of a capacitor dielectric and a counter-electrode.

The surface of the $p^+$ doped layers $4_1$and of support structure 5 is provided with a capacitor dielectric 6. Capacitor dielectric 6 is formed, for example, from a triple layer made of $SiO_2$, $Si_3N_4$ and $SiO_2$ in an oxide-equivalent thickness of 4 nm.

Figure 6:
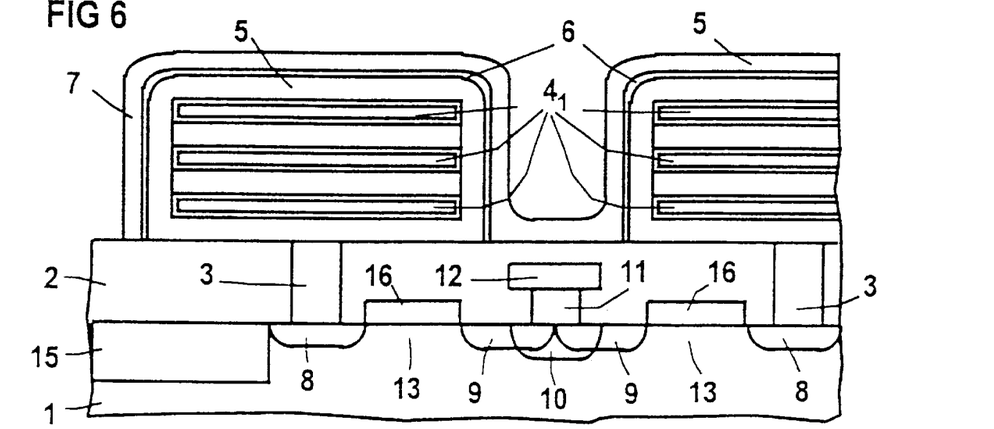
FIG. 6 is a sectional view taken along the line VI—VI in FIG. 5 through the substrate.

A counter-electrode 7 is then formed through deposition of an in situ $p^+$-doped polysilicon layer (see FIG. 5 and FIG. 6).

Selection transistors are indicated in substrate 1 in the cross-section shown in FIG. 6. The $p^+$-doped layers $4_1$and the corresponding support structure 5 form a memory node for a memory capacitor. This memory node is connected to a source/drain area 8 of a selection transistor via the contact 3 disposed underneath. The other source/drain area 9 of the selection transistor is connected to the corresponding source/drain area 9 of the adjacent selection transistor via a connection area 10. Connection area 10 is also connected to a buried bit line 12 via a buried bit line contact 11. Buried bit line 12 and bit line contact 11 are surrounded by insulating layer 2. Between source/drain areas 8 and 9 of a selection transistor are a channel area 13, a non-illustrated gate dielectric and a gate electrode functioning as a word line 14. Word line 14 and bit line contact 11 are each formed of doped polysilicon. Bit line 12 is formed of doped polysilicon, tungsten silicide or tungsten. On the side of source/drain area 8 facing away from bit line 12 is an insulation structure, for example, a shallow trench 15 filled with insulation material designed for insulating between adjacent selection transistor pairs.

Referring now more particularly to the sequence of FIGS. 7–12, an insulating layer 22 is formed on a substrate 21 in a second exemplary embodiment. The substrate 21 is, for example, a monocrystalline silicon wafer, which comprises a plurality of selection transistors, word lines and bit lines. Insulating layer 22 is formed, for example, of $SiO_2$. The surface of insulating layer 22 is planarized in a planarization procedure, for example, through chemical-mechanical polishing or through planarizing etching. Contact holes 23 are opened in insulating layer 22, each of said contact holes reaching a source/drain area of one of the selection transistors in substrate 21. Contact holes 3 are filled with conductive material, for example, tungsten, tantalum, titanium or titanium nitride.

Figure 7:
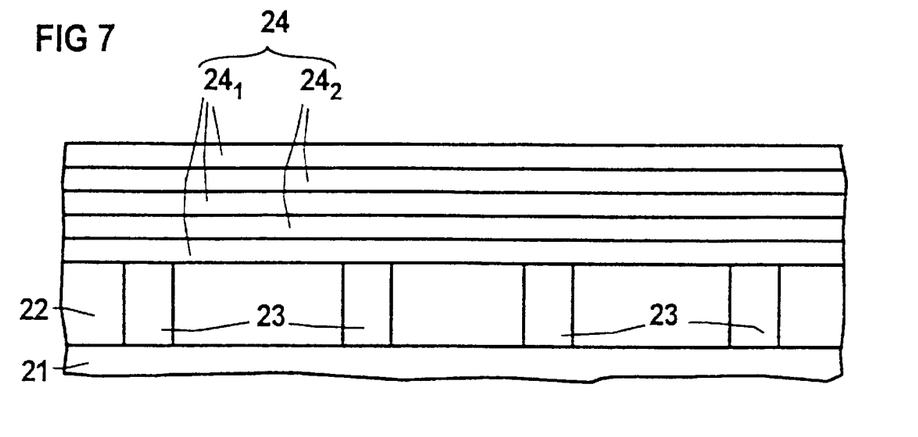
FIG. 7 is a view similar to that of FIG. 1 of an alternative embodiment of the invention, including a substrate having a sequence with alternating layers made of a first material and layers made of a second material.
Figure 8:
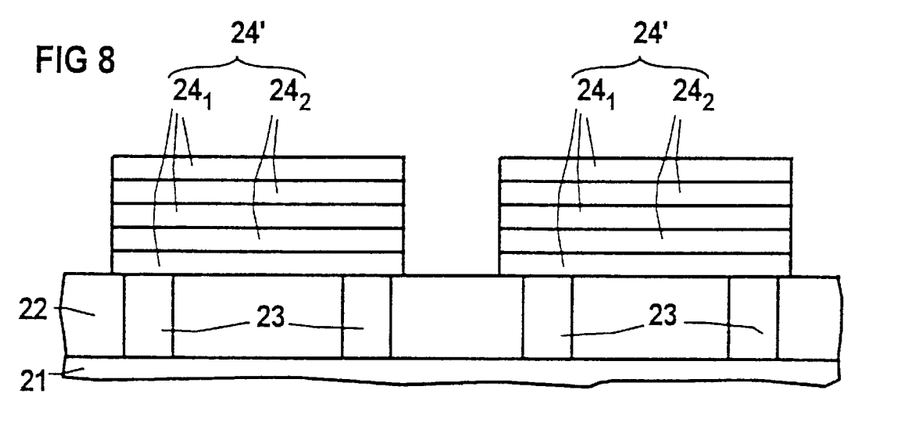
FIG. 8 is an elevational view of the system after the formation of layered structures from the sequence of layers.
Figure 9:
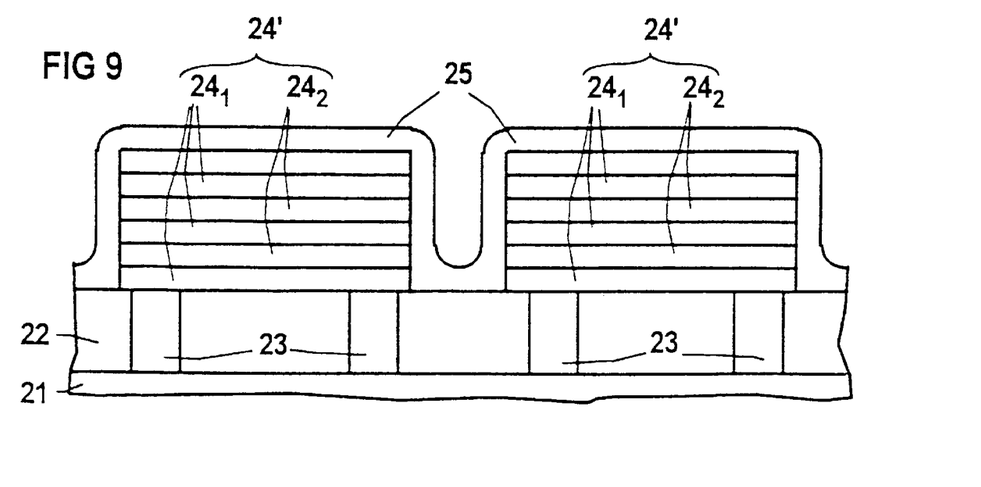
FIG. 9 is a view of the system after the deposition of a layer covering the layered structures.

A sequence of layers 24 is applied to the surface of insulating layer 22, which sequence of layers comprises alternating $p^+$-doped polysilicon layers $24^1$ and $p^-$-doped polysilicon layers $24_2$. The $p^+$-doped polysilicon layers $24_1$ and the $p^-$polysilicon layers $24_2$ each have a thickness of 20 nm. The p+ doped polysilicon layers $24_1$ and the p– doped polysilicon layers $24_2$ are each deposited through in situ doped deposition in a CVD process. One of the p+ doped polysilicon layers $24_1$ is thereby disposed on the surface of insulating layer 22. The uppermost sequence of layers 24 is also formed by one of the p+ doped polysilicon layers $24_1$.

Layered structures 24' are formed from sequence of layers 24 through anisotropic etching with, for example, $CF_4$ and $SF_6$. Outside of layered structures 24', the surface of insulating layer 22 is uncovered (see FIG. 8).

Then, another $p^+$-doped polycrystalline silicon layer 25 is deposited through in situ doped CVD deposition. The $p^+$-doped polycrystalline silicon layer 25 has a thickness of, for example, 30 to 50 nm. It basically has a conformal edge covering (see FIG. 9).

Through anisotropic etch back with, for example, $CF_4$ and $SF_6$, support structures 25' are formed from the other $p^+$-doped polycrystalline silicon layer 25'. Support structures 25' cover the flanks of layered structures 24'(see FIG. 10). In the formation of support structures 25', the surface of insulating layer 22 is uncovered outside of support structures 25' and layered structures 24'.

Figure 10:
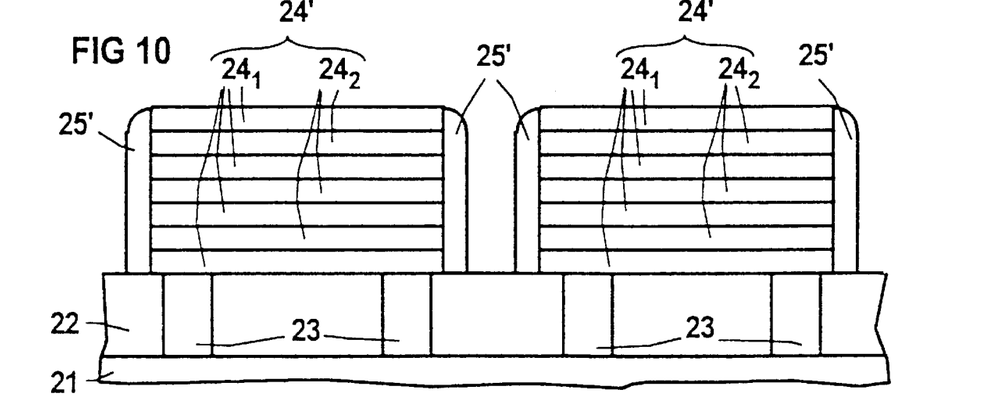
FIG. 10 is a similar view of the system after anisotropic etch back of the layer for building support structures.

With the use of a mask created in a photolithographic manner, layered structures 24' are structured through anisotropic etching, for example, with $CF_4$ and $SF_6$, into two sections each. The two sections are separated from each other by a gap, wherein the surface of insulating layer 22 is uncovered in the region of the gap. In the direction of the gap, the sections each have a flank on which the surfaces of the $p^-$-doped polysilicon layers $24_2$ and the $p^+$-doped polysilicon layers $24_1$ are exposed.

Figure 11:
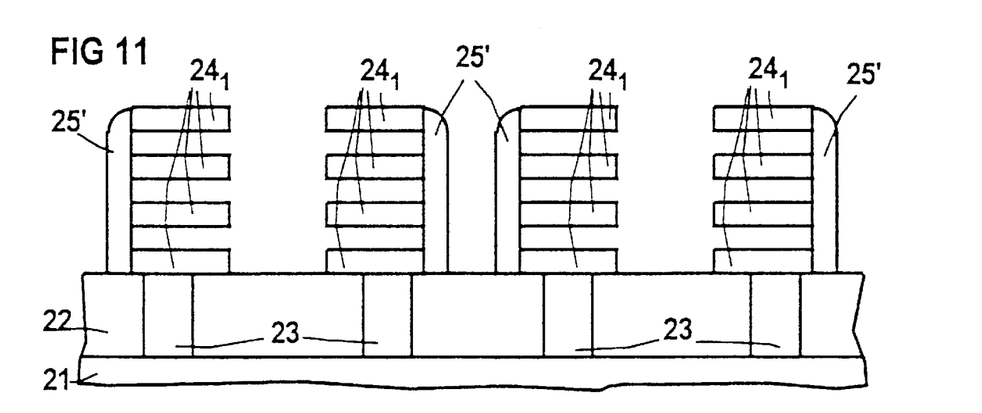
FIG. 11 is a view of the system after the formation of openings in the layered structures and selective etch removal of the layers made of the second material.
Figure 12:
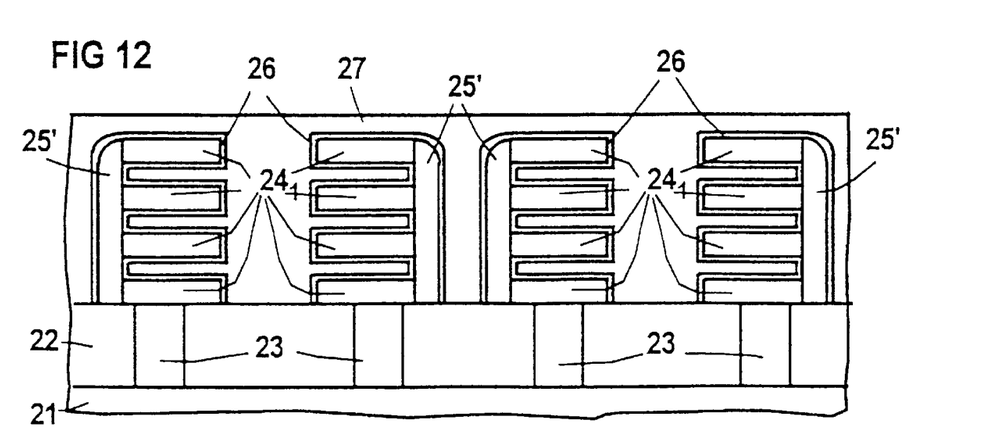
FIG. 12 is an elevational view of the system after the formation of a capacitor dielectric and a counter-electrode.

Through etching that is selective to $p^+$-doped polysilicon and to $SiO_2$, the remaining parts of the $p^-$-doped polysilicon layers $24_2$ are then removed. The selective etching is done, for example, in an alkaline etchant solution containing ethylenediamine, catechol, pyrazine and water. Preferably, the concentration of the solution is in the following region: 1 l ethylenediamine, 160 g catechol, 6 g pyrazine and 133 ml water. KOH can also be used as an etchant solution, with a concentration in the region of 10 to 50 percent in weight.

This etching has a selectivity of at least 1:500 with respect to $p^+$-doped polysilicon and $p^-$-doped polysilicon. In this etching, therefore, neither the remaining parts of the $p^+$-doped polysilicon layers $24_1$ nor support structures 25' are affected (see FIG. 11). The $p^+$-doped polysilicon layers $24_1$ are connected mechanically and electrically to the corresponding support structure 25'.

The surfaces of support structures 25' and of the p+ doped polysilicon layers $24_1$ are provided with a capacitor dielectric 26. Capacitor dielectric 26 comprises, for example, a triple layer made of $SiO_2$, $Si_3N_4$ and $SiO_2$ (known as ONO), having an oxide-equivalent thickness of 4 nm. A counter-electrode 27 is then formed through deposition of a conductive layer. Counter-electrode 27 is formed, for example, through in situ doped deposition of $p^+$-doped polysilicon. The intermediate spaces between adjacent $p^+$-doped polysilicon layers $24_1$ are thereby filled with the material of counter-electrode 27 (see FIG. 12). The $p^+$-doped polysilicon layers $24_1$ associated with support structure 25' form a memory node. The arrangement of selection transistors and the cross-section through the memory capacitors vertical to the plane of projection in FIG. 12 corresponds to the arrangement and the cross-section in FIG. 6.

Figure 13:
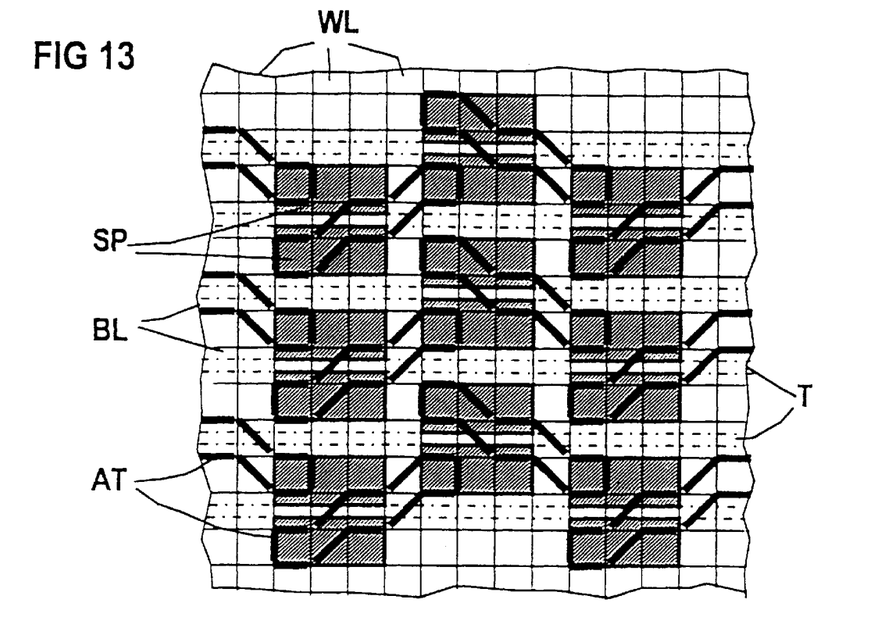
FIG. 13 is a plan view of a system layout in which the layered structures are staggered.

FIG. 13 shows a layout for a dynamic memory cell configuration having memory capacitors manufactured with the procedure in accordance with the invention. Word lines WL and bit lines BL run vertically to each other in the memory cell configuration. The memory capacitors SP are indicated as shaded squares. The position of the selection transistor pairs AT is entered in each case as an emboldened contour line. In manufacture, two memory capacitors are formed from one layered structure 4'or 24'. In the layout in FIG. 13, the broken lines T indicate the separating gaps of the mask which divides up layered structures 4' or 24' into sections corresponding in form to the form of memory capacitors SP. Layered structures 4' or 24' are arranged in columns in this layout, whereby adjacent columns are staggered in relation to each other by half the distance between the center points of adjacent layered structures 4', 24'.

In order to attain the highest possible packing density, it is advantageous to form the layered structures with a square cross-section and a side length of 3 F, where F is the minimum structural size possible with the technology in question. The distance between adjacent layered structures 4', 24' is F. The widths and distances of word lines WL and bit lines BL are then also F. In this case, one memory cell has a space requirement of 8 $F^2$. In order to attain the minimum capacity of 25 fF, which is required for dynamic memory cell configuration, with a structural size F of 0.18 μm, which is designed for the 1 Gbit generation, 12 $p^+$-doped polysilicon layers $4_1$ or $24_1$ are required. With 20 nm as the layer thickness of the p+ doped polysilicon layers $4_1$ or $24_1$ and of the $p^-$-doped polysilicon layers $4_2$ or $24_2$, this results in a stack height of approximately 0.4 μm.

Figure 14:
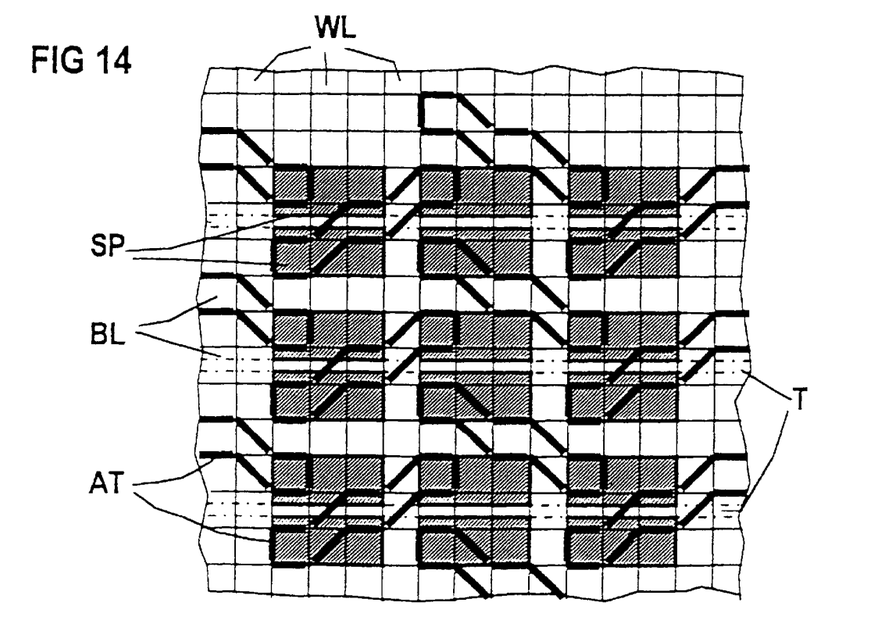
FIG. 14 is a similar view with the layered structures arranged in a grid.

FIG. 14 shows another layout for a dynamic memory cell configuration having a memory capacitor manufactured using the procedure in accordance with the invention. The separating gaps T are again shown, in addition to the word lines WL, bit lines BL, memory capacitors SP and selection transistors AT. This layout differs from the layout shown in FIG. 13 in that layered structures 4', 24', which are divided up to form the sections for the memory capacitors SP, are arranged in a grid-like manner. Adjacent columns are therefore not staggered relative to each other. The distance between adjacent separating gaps T in this layout is twice as big as in the layout shown in FIG. 13. The layout shown in FIG. 13, however, has the advantage of having a more relaxed lithograph on the limit of resolution. This is paid for with finer structures in the separation mask.

Preferably, the separating gaps T in the separating mask are formed through the use of what is known as CARL varnish. With these varnishes, the width of the structural sizes is changed through a secondary chemical treatment, with the result that the separating gap T is narrower than the minimum structural size F possible with the technology in question.

We claim:

1. A process of manufacturing capacitors in a solid state configuration, which comprises:

forming a sequence of layers of a plurality of layers made of a first material alternating with layers made of a second material, the first material being electrically conductive and the second material being selectively etchable relative to the first material;

structuring the sequence of layers and forming at least one layered structure with flanks;

building a support structure of conductive material, the support structure covering at least the flanks of the layered structure;

forming the layers made of the first material and the support structure of $p^+$-doped silicon with a dopant concentration greater than $10^{20}$ $cm^{-3}$, and forming the layers made of the second material of $p^-$-doped silicon with a dopant concentration less than $10^{19}$ $cm^{-3}$;

forming at least one opening in the layered structure and exposing the surface of the layers made of the first and the second material in the at least one opening;

selectively removing the layers made of the second material relative to the layers made of the first material and to the support structure;

providing a capacitor dielectric on the exposed surface of the layers made of the first material and of the support structure; and forming a counter electrode on a surface of the capacitor dielectric.

2. The process according to claim 1,
wherein the step of forming the sequence of layers of the first material alternating with the layers of the second material comprises in situ deposition of polysilicon; and
wherein the building step comprises selective epitaxial growth of doped silicon.

3. The process according to claim 2, wherein the selective epitaxial growth is performed with the use of $SiCl_2H_2$, HCl, $H_2$, $B_3H_6$ in a temperature range between 700° C. and 750° C.

4. The process according to claim 1,
wherein the step of forming the sequence of layers of the first material alternating with the layers of the second material comprises in situ doped deposition of polysilicon; and
wherein the building step comprises in situ doped deposition and anisotropic back etching of a doped polysilicon layer.

5. The process according to claim 1, wherein the step of forming the at least one opening in the layered structure comprises dividing the layered structure with the support structure into two sections separated by a gap.

6. The process according to claim 1, wherein the step of forming a sequence of layers comprises forming the sequence of layers on a substrate, the substrate being a solid state substrate having selection transistors, bit lines, word lines and an insulating layer supporting the sequence of layers.

* * * * *